United States Patent [19]

Sakazaki

[11] Patent Number: 4,875,017
[45] Date of Patent: Oct. 17, 1989

[54] DIGITAL FM DEMODULATING APPARATUS

[75] Inventor: Yoshihisa Sakazaki, Yokohama, Japan

[73] Assignee: Kabushiki Kaisha Toshiba, Kawasaki, Japan

[21] Appl. No.: 280,353

[22] Filed: Dec. 6, 1988

[30] Foreign Application Priority Data

Dec. 8, 1987 [JP] Japan ............................ 62-310020

[51] Int. Cl.$^4$ ............................................ H03D 3/00
[52] U.S. Cl. .................................... 329/336; 329/343; 358/23
[58] Field of Search ................. 329/110, 12, 120, 137, 329/145; 358/23, 310

[56] References Cited

PUBLICATIONS

IEEE International Conference on Consumer Electronics 1986 Jun. THPM14. 1 "Experiments on VTR Digital Processing".

Primary Examiner—Eugene R. LaRoche
Assistant Examiner—Robert J. Pascal
Attorney, Agent, or Firm—Cushman, Darby & Cushman

[57] ABSTRACT

In a digital FM demodulating apparatus of this invention, an input video signal is converted into a predetermined digital FM signal, e.g., $A\sin\theta$ by a recording signal processor and supplied from an input terminal to a phase shift circuit. The phase shift circuit divides digital FM signal $A\sin\theta$ into digital FM signals $A\sin\theta_2$ and $A\cos\theta_2$ phase-shifted from each other through 90° and outputs the signals directly to an operational circuit. The digital FM signal $A\sin\theta$ is converted into digital FM signals $A'\sin\theta_1$ and $A'\cos\theta_1$ delayed from signals $A\sin\theta_2$ and $A\cos\theta_2$ by predetermined periods by registers and supplied to the operational circuit. The operational circuit calculates signals $A\sin\theta_2$, $A\cos\theta_2$, $A'\sin\theta_1$ and $A'\cos\theta_1$. A result of $\tan^{-1}$ conversion of an output from the calculator performed by a ROM having a $\tan^{-1}$ conversion table is obtained as a value obtained by differentiating a phase component of signal $A\sin\theta$ by a time from an output terminal.

5 Claims, 4 Drawing Sheets

DIGITAL FM DEMODULATING APPARATUS

BACKGROUND OF THE INVENTION

1. Field of the Invention

This invention relates to a digital FM demodulating apparatus and, more particularly, to a digital FM demodulating apparatus used in a VTR.

2. Description of the Related Art

As is well known, a conventional digital FM demodulating apparatus, e.g., a digital FM demodulating apparatus used in a VTR (viedo tape recorder) is arranged as shown in FIG. 1. That is, an input video signal is supplied to recording signal processor 12 consisting of an FM modulator and the like. An output from processor 12 is supplied as a digital FM signal to input terminal 16 of digital FM demodulating apparatus 14. The digital FM signal, e.g., signal $A\sin\theta$ is supplied to phase shift circuit 18 to be divided into digital FM signal $A\sin\theta$ and signal $A\cos\theta$ which is phase-shifted from signal $A\sin\theta$ through 90°. Thereafter, signals $A\sin\theta$ $A\cos\theta$ are supplied to absolute value circuits 20 and 22 to be converted into absolute value signals $|A\sin\theta|$ and $|A\cos\theta|$, respectively. Then, divider 24 performs the following division using the absolute value signals:

$$|A\sin\theta|/|A\cos\theta| = |\tan\theta|$$

Division result $|\tan\theta|$ obtained by divider 24 is address data of ROM (read-only memory) 26 which stores a $\tan^{-1}$ conversion table. For this reason, ROM 26 outputs phase data $\theta$ falling within the range of 0 to $\pi/2$. Data $\theta$ is supplied to phase expanding circuit 28 to be converted into phase data $\theta'$ falling within the range of $-\pi$ to $\pi$ on the basis of a pair of digital FM signals $A\sin\theta$ and $A\cos\theta$ output from circuit 18.

Thereafter, data $\theta'$ is supplied to differentiating circuit 30 comprising delay circuit 30a for delaying one cycle of a sampling clock of input digital FM signal $A\sin\theta$ and subtracter 30b, thereby performing the following calculation:

$$\theta_2' - \theta_1' = \tan^{-1} x_2 - \tan^{-1} x_1$$

As a result, signal data $(d\theta'/dt)$ obtained by differentiating data $\theta'$ by time t is output from output terminal 32.

In the conventional digital FM demodulating apparatus having the above arrangement, however, if signal $A\sin\theta$ is represented by an 8-bit complement of 2, an address of ROM 26 requires 21 bits in order to set precision at the output side of ROM 26 to correspond to 11 bits. For this reason, the capacity of ROM 26 must be:

$$2^{21} \times 11 = 23 \text{ megabits}$$

That is, the scale of ROM 26 is increased to complicate and enlarge its arrangement. In addition, since ROM 26 is enlarged, its cost is also increased to pose a problem of economical disadvantage.

SUMMARY OF THE INVENTION

It is, therefore, an object of the present invention to provide a digital FM demodulating apparatus which is economically advantageous because a capacity of a memory for performing $\tan^{-1}$ conversion is decreased to reduce a cost of the memory.

According to an aspect of the present invention, there is provided a digital FM demodulating apparatus comprising: generating means for generating a pair of digital FM signals having a phase difference of 90° on the basis of an input digital FM signal; delay means for delaying the pair of digital FM signals generated by the generating means by a predetermine time period; calculating means for calculating data such that a result of synthesis of outputs from the generating means and the delay means becomes a value obtained by differentiating a phase component of the input digital FM signal by a time; and converting means for performing $\tan^{-1}$ conversion in accordance with the output data from the calculating means in order to obtain the phase component of the input digital FM signal.

BRIEF DESCRIPTION OF THE DRAWINGS

These and other features and advantages of the present invention will become more apparent from the following detailed description of exemplary embodiment as illustrated in the accompanying drawings in which.

DETAILED DESCRIPTION OF THE PREFERRED EMBODIMENT

An embodiment of the present invention will be described below with reference to the accompanying drawings.

Figure 1:
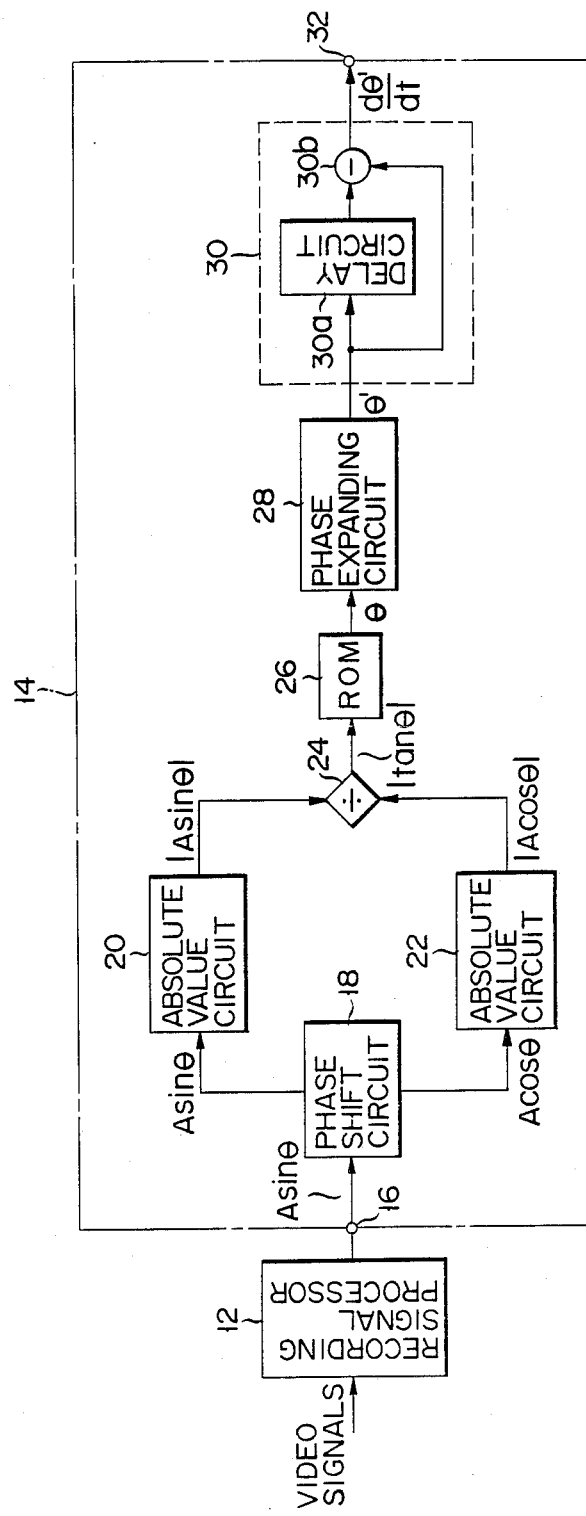
FIG. 1 is a block diagram showing an arrangement of a digital FM demodulating apparatus of a prior art.
Figure 2:
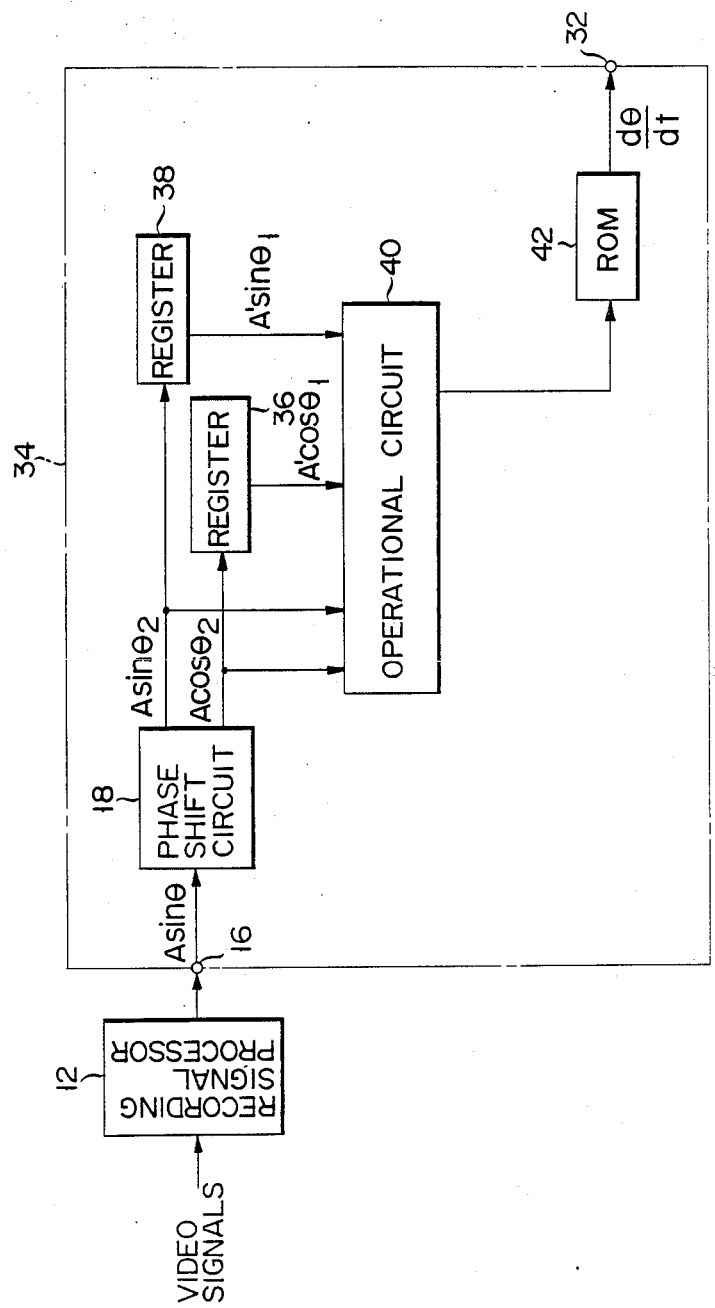
FIG. 2 is a block diagram showing an arrangement of a digital FM demodulating apparatus according to the present invention.

FIG. 2 shows an arrangement of a digital FM demodulating apparatus used in a VTR, in which an input video signal is converted into a predetermined signal by recording signal processor 12 comprising an FM modulator and the like. The converted signal, e.g., digital FM signal $A\sin\theta$ is supplied to input terminal 16 of digital FM demodulating apparatus 34. Signal $A\sin\theta$ supplied to terminal 16 is supplied to phase shift circuit 18. Circuit 18 divides signal $A\sin\theta$ into digital FM signal $A\sin\theta_2$ and digital FM signal $A\cos\theta_2$ which is phase-shifted from signal $A\sin\theta_2$ through 90° and outputs the signals. A pair of signals $A\sin\theta_2$ and $A\cos\theta_2$ are supplied to registers 38 and 36, respectively, and then to operational circuit 40. Registers 36 and 38 are driven by a clock having the same frequency as a sampling frequency of signal $A\sin\theta$ and can delay input signals $A\cos\theta_2$ and $A\sin\theta_2$ by one cycle of the clock. In this manner, registers 36 and 38 generate and output digital FM signals $A'\cos\theta_1$ and $A'\sin\theta_1$ to operational circuit 40.

On the basis of four input signals $A\sin\theta_2$, $A\cos\theta_2$, $A'\sin\theta_1$ and $A'\cos\theta_1$, operational circuit 40 calculates data by which a result of $\tan^{-1}$ conversion becomes a value $(d\theta/dt)$ obtained differentiating phase component $\theta$ of signal $A\sin\theta$ input to terminal 16 by time t.

Output data calculated by operational circuit 40 is supplied to ROM 42 which stores a $\tan^{-1}$ conversion table so as to be used as its address data. By this address data, signal data $(d\theta/dt)$ obtained by differentiating the phase component of signal $A\sin\theta$ by a time is output from output terminal 32.

Figure 3:
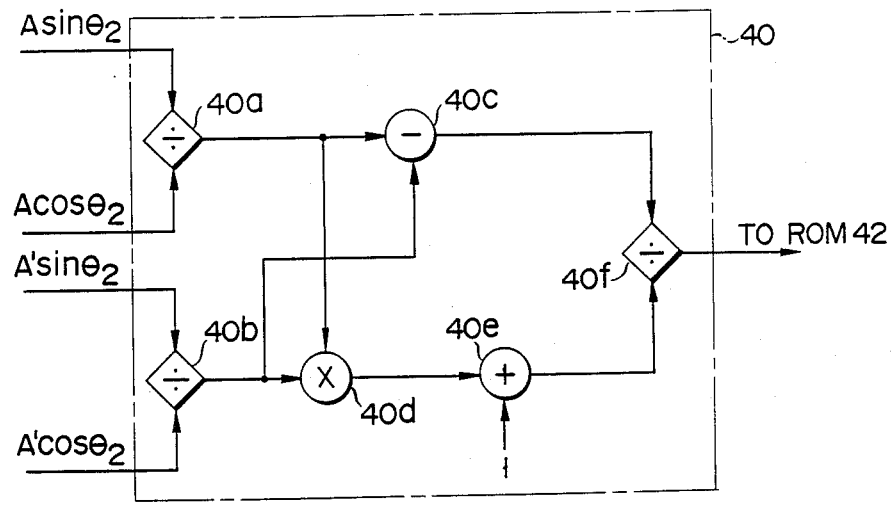
FIG. 3 is a schematic view showing an arrangement of an operational circuit shown in FIG. 2.

Operational circuit 40 is arranged as shown in FIG. 3. That is, signals Asin $\theta_2$ and Acos $\theta_2$ from phase shift circuit 18 are supplied to divider 40a, and signals A'sin $\theta_1$ and A'cos $\theta_1$ delayed by registers 38 and 36 are supplied to divider 40b. Calculation results of dividers 40a and 40b are supplied to subtracter 40c and multiplier 40d, respectively. An output from multiplier 40d is added with "1" by adder 40e and then supplied to divider 40f. This "1" corresponds to "1" in the denominator of the right-side term of equation (2) which will be given later. An output from subtracter 40c is supplied to divider 40f so that division is performed between the outputs from subtracter 40c and adder 40e. As a result, $\Delta\theta = \theta_2 - \theta_1$ is output from divider 40f to ROM 42.

As described above, the signal data ($d\theta/dt$) which is to be finally obtained from terminal 32 of demodulating apparatus 34 is given by the following equation:

$$\theta_2 = \theta_1 = \tan^{-1} x_2 - \tan^{-1} x_1 \quad (1)$$

In order to obtain $\theta_2 - \theta_1$ ($=\Delta\theta$), the right-hand side of equation (1) is rewritten as follows:

$$\tan^{-1} x_2 - \tan^{-1} x_1 = \tan^{-1}\{(x_2 - x_1)/(1 + x_1 x_2)\} \quad (2)$$

In this case, the contents in { } of equation (2) represent the input of ROM 42, i.e., the output data from operational circuit 40. $x_1$ and $x_2$ are given as follows:

$$x_1 = A'\cos\theta_1 / A'\sin\theta_1 \quad (3)$$

$$x_2 = A\cos\theta_2 / A\sin\theta_2 \quad (4)$$

Therefore, referring to FIG. 3, equations (3) and (4) are substituted in equation (2) to obtain the following equation:

$$\tan^{-1}\{(x_2 - x_1)/(1 + x_1 x_2)\} = \tan^{-1}\{(\cos\theta_2\sin\theta_1 - \cos\theta_1\sin\theta_2)/(\sin\theta_1\sin\theta_2 - \cos\theta_1\cos\theta_2)\} \quad (5)$$

In this case, the contents in { } of equation (5) represent the input data of ROM 42, i.e., the output data from operational circuit 40.

On the basis of four input signals Asin $\theta_2$, Acos $\theta_2$, A'sin $\theta_1$ and A'cos $\theta_1$, operational circuit 40 calculates the right-hand side of equation (5) by the respective calculator components shown in FIG. 3. As a result, the output data from operational circuit 40 is supplied to ROM 42, so that ROM 42 generates data by which the result of $\tan^{-1}$ conversion becomes the value ($d\theta/dt$) obtained by differentiating phase component $\theta$ of signal Asin $\theta$ by time t.

By using the output data from calculator 40 as the address data of ROM 42 which stores the $\tan^{-1}$ conversion table, the signal data ($d\theta/dt$) obtained by differentiating the phase component of signal Asin $\theta$ supplied to terminal 16 can be output from terminal 32.

Figure 4:
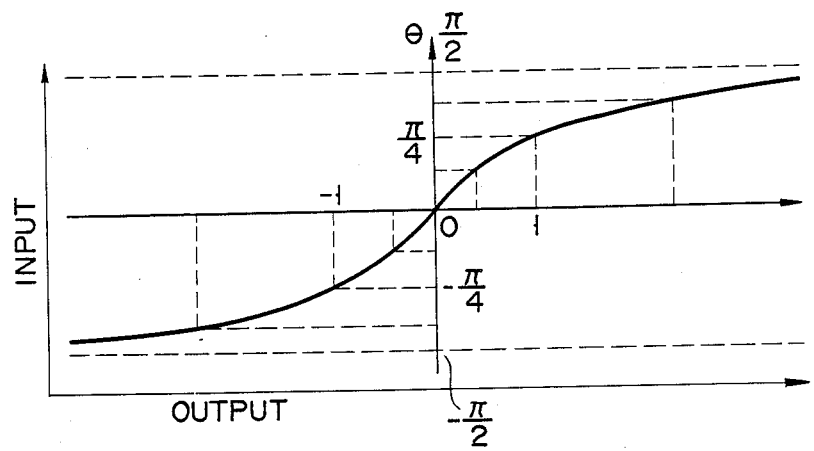
FIG. 4 is a graph showing input/output characteristics of $\tan^{-1}$ conversion schematically showing stored contents of a ROM shown in FIG. 2.

FIG. 4 shows the contents of the $\tan^{-1}$ conversion table stored in ROM 42 in correspondence with an inverse tangent curve. In FIG. 4, the ordinate represents address data at the input side of ROM 42; and the abscissa, those at its output side. In practice, numerical values are stored.

According to the arrangement of the above embodiment, if, for example, a frequency component of signal Asin $\theta$ supplied to terminal 16 is less than $\frac{1}{8}$ of the sampling frequency, the signal data ($d\theta/dt$) finally obtained from ROM 42, i.e., terminal 32 falls within the following range:

$$0 \leq d\theta/dt < \pi/4$$

For this reason, the $\tan^{-1}$ conversion table to be stored in ROM 42 need only correspond to the range from 0 to $\pi/4$ of phase $\theta$ of input signal Asin $\theta$. Therefore, the capacity of ROM 42 can be decreased smaller than those of conventional ROMs. In addition, a cost can be reduced by this decrease in the capacity of the ROM, resulting in an economical advantage.

For example, in order to obtain output precision of ten bits of ROM 42, the address (input side) of ROM 42 need only have 11 bits. For this reason, the capacity of ROM 42 is calculated to be:

$$2^{11} \times 10 = 2 \text{ megabits}$$

That is, the capacity of ROM 42 can be reduced to about 1/10 those of the conventional ROMs.

Figure 5:
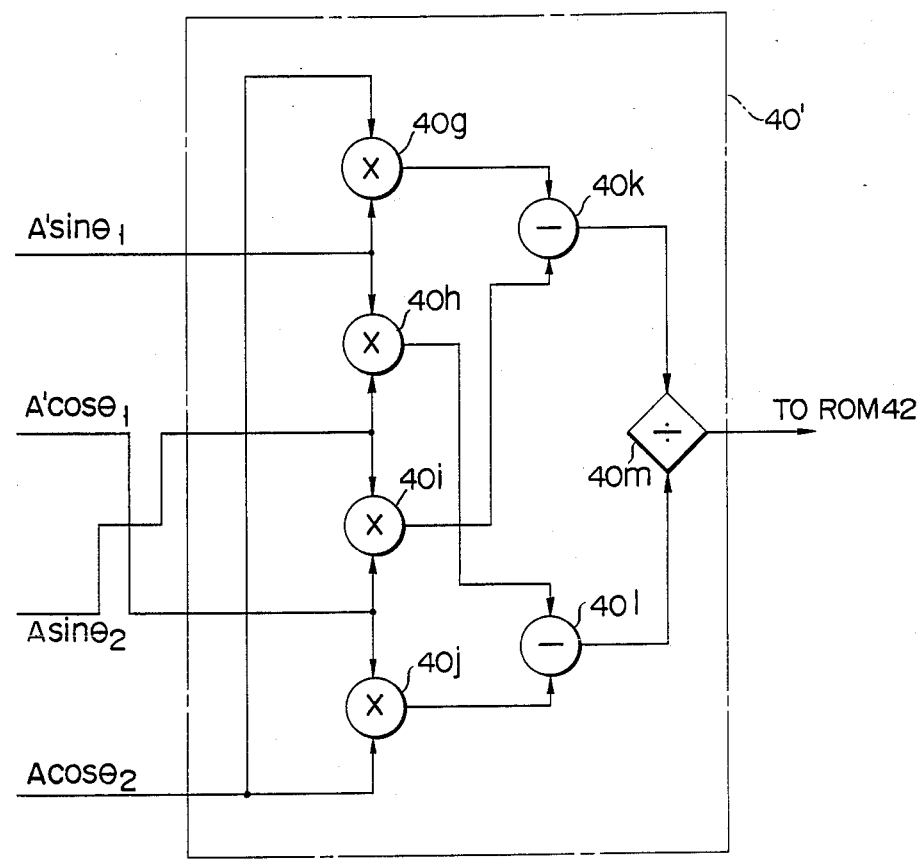
FIG. 5 is a schematic view showing another arrangement of the operational circuit shown in FIG. 2.

FIG. 5 shows a modification 40' of operational circuit 40 shown in FIG. 2. As is shown in this figure, circuit 40' comprises multipliers 40g, 40h, 40i and 40j, subtractors 40k and 40l, and divider 40m. Signal Asin $\theta_2$ output by phase shift circuit 18 is supplied to multipliers 40h and 40i. Signal Acos $\theta_2$, also output by circuit 18, is supplied to multipliers 40g and 40j. Signal A'sin $\theta_1$, which has been delayed by register 38, is input to multipliers 40g and 40h. Signal A'cos $\theta_1$, which has been delayed by register 36, is input to multipliers 40i and 40j. The products, which multipliers 40g and 40i have made, are supplied to subtractor 40k, whereas the products, which multipliers 40h and 40j have made, are supplied to subtractor 40l. The differences, which subtractors 40k and 40l have obtained, are output to divider 40m, which divides the difference output by subtractor 40k by the difference output by subtractor 40l, thus providing $\Delta\theta$ ($=\theta_2-\theta_1$). The value, $\Delta\theta$, thus obtained, is output from divider 40m to ROM 42.

What is claimed is:

1. A digital FM demodulating apparatus comprising:
   generating means for generating a pair of digital FM signals having a phase difference of 90° on the basis of an input digital FM signal;
   delay means for delaying the pair of digital FM signals generated by said generating means by a predetermined time period;
   calculating means for calculating data such that a result of synthesis of outputs from said generating means and said delay means becomes a value obtained by differentiating a phase component of the input digital FM signal by a time; and
   converting means for performing $\tan^{-1}$ conversion in accordance with the output data from said calculating means in order to obtain the phase component of the input digital FM signal.

2. An apparatus according to claim 1, wherein said calculating means performs calculation such that a result of $\tan^{-1}$ conversion performed by said converting means on the basis of the output data from said calculating means becomes the value obtained by differentiating the phase component of the input digital FM signal.

3. An apparatus according to claim 1, wherein said delay means delays the pair of digital FM signals generated by said generating means by a time period corresponding to a predetermined sampling interval, respectively.

4. An apparatus according to claim 1, wherein said delay means comprise registers.

5. An apparatus according to claim 1, wherein said converting means includes memory means which stores a $\tan^{-1}$ conversion table.

* * * * *

UNITED STATES PATENT AND TRADEMARK OFFICE
CERTIFICATE OF CORRECTION

PATENT NO. : 4,875,017
DATED : October 17, 1989
INVENTOR(S) : Sakazaki , Yoshihisa It is certified that error appears in the above-identified patent and that said Letters Patent is hereby corrected as shown below:

Column 3, line 18, change equation (1) to the following:

-- $\theta_2 - \theta_1 = \tan^{-1} x_2 - \tan^{-1} x_1$ --

Column 3, line 29, change equation (3) to the following:

-- $x1 = A' \sin\theta_1 / A' \cos\theta_1$ --

Column 3, line 31, change equation (4) to the following:

-- $x2 = A \sin\theta_2 / A \cos\theta_2$ --

UNITED STATES PATENT AND TRADEMARK OFFICE
CERTIFICATE OF CORRECTION

PATENT NO. : 4,875,017

DATED : October 17, 1989

INVENTOR(S) : Sakazaki Yoshihisa

It is certified that error appears in the above-identified patent and that said Letters Patent is hereby corrected as shown below:

Column 3, lines 37 and 38, change equation (5) to the following:

$$--\tan^{-1}\{(x_2 - x_1)/(1 + x_1 x_2)\}$$
$$= \tan^{-1}\{(\cos\theta_1 \sin\theta_2 - \sin\theta_1 \cos\theta_2)/(\cos\theta_1 \cos\theta_2 + \sin\theta_1 \sin\theta_2)\}--$$

Signed and Sealed this

Second Day of June, 1992

*Attest:*

DOUGLAS B. COMER

*Attesting Officer*  *Acting Commissioner of Patents and Trademarks*